US008791418B2

(12) United States Patent
Visconti et al.

(10) Patent No.: US 8,791,418 B2
(45) Date of Patent: Jul. 29, 2014

(54) INCREASING THE SPATIAL RESOLUTION OF DOSIMETRY SENSORS

(75) Inventors: Angelo Visconti, Appiano Gentile (IT); Mauro Bonanomi, Cassano D'Adda (IT); Giorgio Cellere, Vicenza (IT); Alessandro Paccagnella, Padova (IT)

(73) Assignee: Micron Technology, Inc., Boise, ID (US)

( * ) Notice: Subject to any disclaimer, the term of this patent is extended or adjusted under 35 U.S.C. 154(b) by 1033 days.

(21) Appl. No.: 12/329,740

(22) Filed: Dec. 8, 2008

(65) Prior Publication Data
US 2010/0140488 A1    Jun. 10, 2010

(51) Int. Cl.
*G01T 1/02*     (2006.01)
*H04N 5/357*    (2011.01)
*H01L 31/115*   (2006.01)

(52) U.S. Cl.
CPC ........... *G01T 1/026* (2013.01); *H04N 5/357* (2013.01); *H01L 31/115* (2013.01)
USPC ................................. 250/370.07; 250/370.01

(58) Field of Classification Search
CPC .......... H01L 27/14609; H01L 31/115; A61N 5/1064; A61N 5/1071; A61N 5/1075; A61N 5/1048; H04N 5/3205; H04N 5/357; H04N 5/365; H04N 5/359; G01T 1/026; G01T 1/247; G01T 7/005
USPC ............. 250/370.1, 370.07, 370.14; 438/156
See application file for complete search history.

(56) References Cited

U.S. PATENT DOCUMENTS

| | | | |
|---|---|---|---|
| 4,804,848 A * | 2/1989 | Horiba et al. | 250/394 |
| 5,596,199 A * | 1/1997 | McNulty et al. | 250/370.07 |
| 5,949,075 A | 9/1999 | Kishi | |
| 6,172,368 B1 * | 1/2001 | Tarr et al. | 250/370.07 |
| 2006/0027756 A1 | 2/2006 | Thomson et al. | |
| 2007/0013415 A1 * | 1/2007 | Owen | 327/77 |
| 2008/0235796 A1 * | 9/2008 | Buhr | 726/22 |
| 2009/0146068 A1 * | 6/2009 | Agarwal | 250/370.07 |

FOREIGN PATENT DOCUMENTS

WO    WO 2006/05916    *    6/2006

OTHER PUBLICATIONS

Cellere et al. "Single-ion dosemeter based on floating gate memories," Radiation Protection Dosimetry, vol. 122, Iss. 1-4, pp. 457-459, published Nov. 28, 2006. Retrieved from internet [Sep. 8, 2011]; Retrieved from URL <http://rpd.oxfordjournals.org/content/122/1-4/457.abstract.>.*

McNulty et al., "Improvements in Resolution and Dynamic Range for FGMos Dosimetry," IEEE Transactions on Nuclear Science, vol. 52, No. 6, pp. 2597-2601, published Dec. 2005. Retrieved from internet [Sep. 8, 2011]; Retrieved from URL <http://ieeexplore.ieee.org/iel5/23/33493/01589244.pdf?arnumber=1589244>.*

(Continued)

*Primary Examiner* — David Porta
*Assistant Examiner* — Yara B Green
(74) *Attorney, Agent, or Firm* — Dorsey & Whitney LLP

(57) ABSTRACT

A two-dimensional array of memory cells may be used to implement a spatial dosimeter. The two-dimensional array of cells may be implemented by an integrated circuit memory. Because of the relatively small size of the integrated circuit memory, the resolution of the resulting array may be less than 100 nanometers. The change in threshold voltage of each of the cells, as a result of radiation exposure, may be used to calculate the dose seen at each cell, allowing dose profiles in two dimensions with sub-micrometer resolution.

16 Claims, 2 Drawing Sheets

(56) References Cited

OTHER PUBLICATIONS

Hopkinson et al., "A Guide to the Use and Calibration of Detector Array Equipment," SPIE—The International Society for Optical Engineering, published 2004, The Society for Optical Instrumentation Engineers, pp. 25-29.*

Cellere et al., "A Model for TID Effects on Floating Gate Memory Cells", IEEE Transactions on Nuclear Science, vol. 51, No. 6, Dec. 2004, pp. 3753-3758.

* cited by examiner

INCREASING THE SPATIAL RESOLUTION OF DOSIMETRY SENSORS

BACKGROUND

This relates generally to dosimetry sensors.

A dosimetry sensor senses dose. Dose is the energy received from an ionizing radiation source by a given material per unit of mass.

Dosimetry applications are numerous. For example, dosimetry may be utilized in security systems, sterilization applications, high energy physics, space applications, and medical applications.

Spatial dosimetry determines a localized measurement of radiation dose at particular positions over a distance in one or more dimensions. An example of an application of spatial dosimetry is determining the radiation dose applied by an ionizing source to a tumor. Ideally, the highest radiation dose is directed at the tumor, while the healthy tissue, where the tumor does not exist, is exposed to the lowest possible dose. To this end, two or three dimensional spatial dosimetry may be used to measure the radiation exposure across the tumor and in the regions proximate to the tumor.

DETAILED DESCRIPTION

In accordance with some embodiments, a dosimetry system may have a spatial resolution in the order of magnitude of at least a micrometer and, in some embodiments, a sub-micrometer resolution. An array of memory cells whose electrical properties are changed by irradiation may be used as a spatial radiation sensor. A two-dimensional array of floating gate non-volatile memory cells, such as flash memory cells, may be used as the sensor elements. Also, nitride trapping devices and/or nanocrystal flash memories may be used as the cells. The memory cells are integrated in a semiconductor substrate with the circuits needed to control the cell array. For example, the sensor may be an array, complete with the control circuitry and designed ad hoc for the application or it may be a standard commercial memory, such as a NOR or a NAND flash memory array.

In some embodiments, an integrated array of cells allows increased spatial resolution. The order of magnitude of the spatial resolution may correspond generally to the feature size of the memory. In fact, the maximum resolution is a function of the distance between adjacent cells which, in turn, is a function of the cell size. Hence, the theoretical maximum resolution is twice the technology pitch. As smaller memories are developed, the resolution may increase.

With current technology using 60 to 70 nanometer feature size cells, resolutions in the 60 nanometer range may currently be possible.

In some embodiments, the radiation that is being measured deposits its energy uniformly across a material as is commonly the case with electrons, protons, and photons, including x-rays and gamma rays. Some embodiments may be applicable to heavy ions, especially where the fluence of heavy ions is large enough to result in a distribution of dose that is sufficiently uniform at the micrometer scale.

Figure 1:
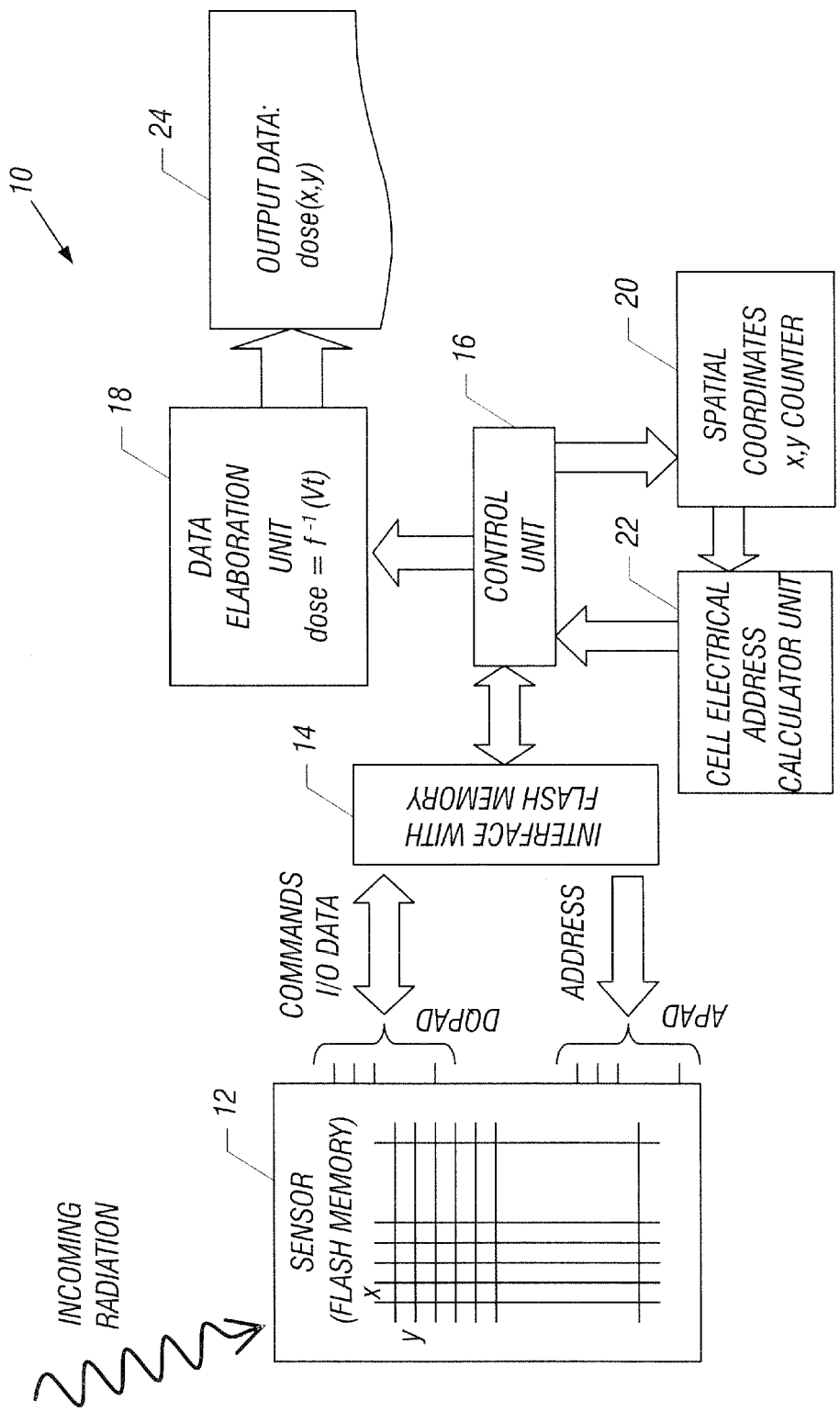
FIG. 1 is a dosimetry system in accordance with one embodiment of the present invention.

Referring to FIG. 1, a dosimetry system 10 may include a sensor 12. In one embodiment, the sensor 12 may be a NOR or a NAND flash memory array. In some embodiments, the sensor may be an array of nitride trapping memory cells. In some embodiments, the array may have a distance between adjacent cells making up the array of less than 100 nanometers and, in one embodiment, the distance may be less than about 75 nanometers.

In all charge storage or charge trapping memory devices, radiation removes part of the charge stored or trapped. This includes but is not limited to floating gate, nitride trapping, nanocrystal memories. In a flash memory embodiment, radiation removes excess electrons or holes from a floating gate, hence changing the cell threshold voltage. The floating gates may be designed to keep the number of excess holes or electrons unaltered over very long periods of time, so that one can effectively program the cells, expose them, read them once again, and still be sure that the degradation of the threshold voltage is due primarily, if not solely, to radiation.

The sensor 12, which is a flash memory in one embodiment, can receive commands, input/output (I/O) data and address information as indicated. An interface 14 may be provided between a control unit 16 and the sensor array 12. The control unit 16 may correspond to a memory controller in one embodiment. The control unit 16 may provide spatial coordinates to an x,y counter 20 which, in turn, may provide an input to a cell electrical address calculator unit 22. The output of the calculator unit 22 may be coupled back to the control unit 16.

The calculator unit 22 converts spatial or physical coordinates into binary cell addresses of cells. This conversion may be done using a first order polynomial expression, having coefficients that vary from chip-to-chip. Alternatively, a lookup table may be used to convert between logical addresses and physical cell positions. In some cases, multiple tables may be provided to accommodate for different chip layout schemes. A data elaboration unit 18 may determine the dose and provide a dose output as indicated at 24.

The control unit 16, together with the elaboration unit 18, sends commands to the flash memory 12 and reads data. In one embodiment, this reading is done using existing algorithms internal to the flash memory, called test modes. In some embodiments, the control and elaboration system may also use software only. Some of these embodiments manage the addressing of the memory cells of the sensor 12. The control and elaboration units may also be responsible for the interpretation of the data by comparing the data read after a radiation with calibration data. The results may be expressed as absorbed dose as a function of spatial coordinates x,y of the sensor over the sensor surface.

A floating gate charge loss model may be based on charge generation/recombination in the dielectrics around the floating gate and on charge emission from the floating gate. Such a model is used in order to translate the measured information (the floating gate cell threshold voltage) into an adsorbed dose information. Details of the model depend on the technology used and on the nature of the radiation. For simplicity, the model is described in the following for flash memory cells irradiated with high energy photons (including as x-rays and gamma rays), electrons, or protons. Similar concepts apply to different technologies-embodiments such as nitride trapping memory cells or nanocrystals.

The model can be implemented in different ways. In its easiest form, the evolution of the threshold voltage Vth as a function of the adsorbed dose is measured and then a simple exponential relationship is used to fit the evolution. Such a relationship can be reversed in order to derive the adsorbed dose from the difference between that threshold voltage of the cell before the accumulation of the given dose and the value of the latter.

In a more complex form, the model can be based on a description of the physics underlying the loss of charge from the floating gate. Such a model has the advantage of being able to better describe the observed relationship between threshold voltage and dose. More importantly, it allows estimating the needed relationship for devices not yet available. In the following, the model is described in its fundamental parts, referring to a device programmed in the "0" (electrons stored in the floating gate) state only, for sake of simplicity. Almost identical considerations apply for a device programmed in the "1" state (holes stored in the floating gate) or to a device programmed in intermediate states (such as in multilevel cells).

The effect of radiation on the floating gate involves three contributions. The first is the charge generated in the tunnel oxide. An electron/hole pair is generated in tunnel oxide every 17 eV lost by the incoming radiation. Following generation, part of these charges recombine, also depending on the electric field (larger electric field separates the electrons and holes more efficiently). The exact relationship between the electric field and the charge yield (defined as the percentage of charges which do not recombine) depends on the nature and energy of incoming radiation. Regardless of the charge yield, holes surviving recombination will drift toward the floating gate and electrons will drift toward the substrate due to the electric field. Once holes reach the floating gate they recombine part of the stored charge.

The second contribution arises from charge generated in the interpoly dielectric. If this is realized with a pure silicon oxide layer, the same description done for the tunnel oxide applies here. If, as usual with NAND and NOR flash memories, the interpoly dielectric is an oxide-nitride-oxide sandwich (ONO) the physics is slightly more complex. In fact, the charge yield in the nitride is almost zero even with moderate fields; that is, all charge generated in the nitride will recombine. Charge generated in the lower oxide layer (the one in contact with the floating gate) will partly recombine, and partly be injected in the floating gate where it recombines part of the stored charge. Charge generated in the upper oxide layer (the one in contact with the control gate) will partly recombine, and partly be injected in the nitride layer, where it will be trapped and contribute to a shift in the threshold voltage of the memory cell. Finally, the interpoly dielectric may be realized with more advanced technologies, including, for example, multiple layers of different materials, material with dielectric constant higher or lower that that of silicon oxide, materials with peculiar trapping behaviors, materials with different barrier heights, and so on. Regardless of these details, the overall effect of charges generated in the interpoly dielectric can be modeled as the sum of the generation, recombination, drift, and trapping in the different layers.

The third contribution is due to the direct interaction between radiation and charges in the floating gate. This interaction gives rise to the emission of energetic electrons from the floating gate. The details on the physical effect depends on the nature of the incoming radiation (protons, electrons, photons) and on its energy. For example, gamma rays mainly interact with matter through Compton scattering, whereas for x-rays photoemission prevails. Regardless of these details, the net effect is that electrons stored in the floating gate gain enough energy from the radiation to jump over the barrier. The amount of electrons able to overcome the oxide barrier depends on both the nature of the radiation and on the details of the design and process of the memory array.

The sum of the three contributions (charge generated in the tunnel oxide, charge generated in the interpoly dielectric, charge emitted from the floating gate) yield a relationship which allows quantitatively evaluate the shift of the threshold voltage of the memory cell as a function of the total dose. By inverting this relationship one can calculate the adsorbed dose for a floating gate by knowing its threshold voltage before and after the dose has been delivered. Note that the evolution of threshold voltage is a function of both the total dose and the electric field in the oxides. Hence, it depends on the threshold voltage of the cell before irradiation and on its intrinsic threshold voltage, that is, the threshold voltage of the cell when no excess electron or hole is stored in the floating gate (Vth, UV).

While an embodiment is described that is two dimensional, one dimensional embodiments may be implemented by scanning the cell array along the row or column directions only.

Figure 2:
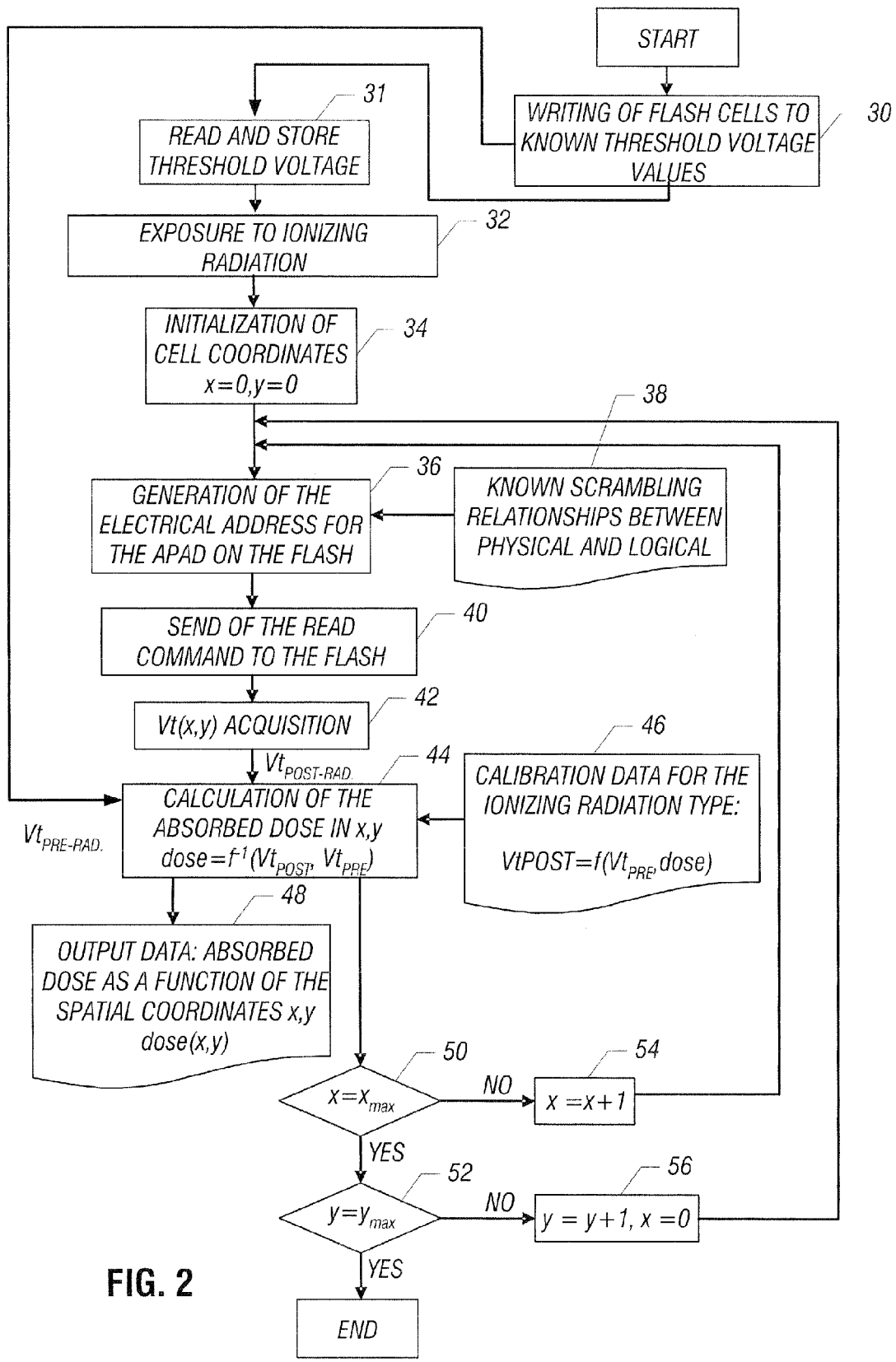
FIG. 2 is a flow chart for a sequence in accordance with the embodiment shown in FIG. 1 in accordance with one embodiment.

Referring to FIG. 2, in one embodiment, a sequence of operations may be implemented in software, hardware, or firmware. Thus, the sequence depicted in FIG. 2 may be implemented by a processor-based device, such as the control unit 16 or the data elaboration unit 18 or a combination of the two, in some embodiments.

Initially, the memory cells are written to known threshold voltage values, as indicated at 30. For example, a zero may be written into each cell. The threshold voltages of all the cells may then be read and stored, for example, by using a test mode, as indicated in block 31. Then, the cell sensors 12 may be exposed to ionizing radiation, as indicated in block 32. As examples, the radiation may be x-rays or gamma rays. The cell coordinates may be initialized so that the positions of the various cells can be correlated to their spatial positions, as indicated in block 34.

Then, in block 36, an electrical address for the address pad (APAD) of the sensor 12 is generated. Known scrambling relationships between physical and logical layouts may be exploited, as indicated at block 38. A read command is sent to the sensor 12, as indicated at block 40.

A threshold voltage at a given location is then acquired, as indicated at block 42. A flash memory has a "test mode" (that is usually not accessed by users) for testing the memory during development and during electrical testing sort, before sale of the memory.

Some of these "test modes" also provide the capability to do a sequence of analog readings of the cell, varying (stepping) the gate voltage over a suitably wide range. Then, using an increasing gate voltage over time, at the output, there is a digital signal constituted initially by a sequence of "0s" (because at low voltage the cell does not sink current and then is seen as a "0" cell) and when the gate voltage approaches and passes the threshold voltage of the cell, the corresponding digital signal changes to a sequence of "1s". So, acquiring for each cell the digital signal resulting form the various readings at various gate voltages, that particular gate voltage is established at which the cell starts to sink current and this gate voltage is the threshold voltage.

Typically, the manufacturers of the chip do the tests of the chip using an appropriate test machine that is usually able (once it is opportunely programmed) to completely control all the features of the chip and these "test modes". On the other hand, the board and system used by the customer obviously can only use the chip in the standard "user mode". For the dosimetry applications, the system that uses a commercial flash memory may use this "test mode" feature, implemented as a function of the interface 14, appearing in FIG. 1. If a test mode is not used in a commercial flash memory, but, instead, a flash memory array is designed to be dedicated to dosimetry, then the interface 14 can control that array in a way that essentially reproduces the threshold reading previously described in the test mode.

This threshold voltage reading may be used because it is the electrical parameter of the cell that is directly linked to the charge stored in the floating gate of the cell memory which is, at the same time, the most important physical quantity affected by the radiation interaction.

The change of threshold voltage from before exposure ($V_{tPRE}$) to after exposure ($V_{tPOST}$) is directly related to the dose, as described above. In block 44, the absorbed dose at a given x,y position is calculated using the data elaboration unit 18. The dose is equal to $f^{-1}$ ($V_{tPOST}$, $V_{tPRE}$). The calculated dose is then sent to an output, as indicated at block 44. The output data, in one embodiment, may be the absorbed dose as a function of the spatial coordinates x,y. The calculation of the absorbed dose may utilize calibration data for the ionizing radiation type, as indicated in block 46. The exact relationship may be determined experimentally on a case-by-case basis, depending on the type of used memory and radiation. For flash memory cells, the threshold voltage after exposure $V_{tPOST}$ is a function of the threshold voltage $V_{tPRE,DOSE}$ before exposure of the intrinsic threshold voltage of that cell, Vth,UV, and of the dose:

$$VtPOST = f(Vth, PRE, Vt, UV, dose)$$

so that:

$$dose = f^{-1}(VtPOST, VtPRE, VtUV)$$

Hence, one has different strategies to determine the spatial distribution of dose:

i) measure Vt,UV of all cells and store data; program all cells, for example to "0"; read the Vt,PRE of all cells and store data; irradiate the array; read the VtPOST of all cells; calculate dose(x,y). This method guarantees maximum accuracy but it is complex and requires storing lot of data.

ii) program all cells, for example to "0"; read the Vt,PRE of all cells and store data; irradiate the array; read the VtPOST of all cells; calculate dose(x,y) by using an average value for Vth,UV instead than the exact value of each cell. This method is someway less precise but faster. The main advantage is that VthUV is difficult to measure in modern memories.

iii) measure Vt,UV of all cells and store data; program all cells to the save exact Vt,PRE; irradiate the array; read the VtPOST of all cells; calculate dose(x,y). This method needs a more complex program algorithm but requires less computational power.

iv) program all cells to the save exact Vt,PRE; irradiate the array; read the VtPOST of all cells; calculate dose(x,y). This method needs a complex program algorithm and is inaccurate.

Note that, by using devices other than flash memories, the same basic concepts apply, when one writes "a measurable cell parameter, measured before irradiation" instead than "VthPRE"; "a measurable cell parameter, measured after irradiation" instead than "VthPOST", "any number of measurable intrinsic cell parameters" instead than "VthUV".

As another example, an analytical expression or a filtering function, such as a polynomial expression or a spline function, may be derived to correlate threshold voltage and dose, at least for a particular sensor and a particular type of radiation. The coefficients of such an expression or function may still need to be derived experimentally by exposing the sensor to different known doses and measuring the threshold voltage change that results.

In diamond 50, a check determines whether the position in the x direction is equal to the maximum x coordinate position. If not, x is incremented, as indicated at block 54. If so, a check at diamond 52 determines whether the last column has been analyzed. If no, the next column is addressed, as indicated in block 56. If the last row and the last column have been analyzed, the flow may end.

The system can be implemented either as an online system (with faster acquisition) or as an offline system. An online system is faster and may be essential for some applications. An offline system does not need bulky equipment very close to the sensor which can be extremely small.

As a practical example, to cure brain tumors not treatable by surgery, radiotherapy treatments may be utilized. A distribution of dose consisting of many peaks, about 50 micrometers wide and spaced by tens to hundreds of micrometers, is used. In this way, it is possible to deliver very high doses to the tumor without destroying a substantial amount of surrounding tissue.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   programming each of the plurality of cells;
   measuring a pre-exposure threshold voltage of each of the plurality of cells;
   exposing the plurality of cells to ionizing radiation;
   measuring a post-exposure threshold voltage of each of the plurality of cells; and
   determining a radiation dose of each of the plurality of cells based, at least in part, on the respective post-exposure threshold voltages of each of the plurality of cells and a predetermined average value for an intrinsic threshold voltage of the plurality of cells.

2. The method of claim 1, wherein the plurality of cells comprises a two-dimensional array of cells.

3. The method of claim 1, further comprising determining dose in two dimensions with better than 100 nanometer resolution.

4. The method of claim 1, further comprising correlating an address of each of the plurality of cells to a respective position in a two-dimensional array.

5. The method of claim 1, wherein said determining a radiation dose at each of the plurality of said cells comprises performing an analog reading on each of the plurality of cells.

6. The method of claim wherein said determining a radiation dose at each of the plurality of cells includes measuring the threshold voltages of an array of cells of a flash memory with a test mode.

7. A computer readable medium storing instructions to enable a processor-based device to:

determine a change in threshold voltage for each of a plurality of cells in a two-dimensional array of an integrated memory as a result of exposure of the plurality of cells to ionizing radiation,
wherein the change in threshold voltage for each of the plurality of cells is based on a respective intrinsic threshold voltage, a respective pre-exposure threshold voltage, and a respective post-exposure threshold voltage;
correlating a position of each cell in said two-dimensional array to as respective address;
calculating a dose of the ionizing radiation at the position of each of said cells in said two-dimensional array, the dose based, at least in part, on the respective post-exposure threshold voltages of each of the plurality of cells and a predetermined average value for an intrinsic threshold voltage.

8. The medium of claim 7, further including determining a spatial dose with a resolution of less than 100 nanometers.

9. The medium of claim 7, including programming the cells before exposing the cells to ionizing radiation.

10. A spatial dosimeter comprising:
an array of memory cells arranged in two dimensions; and
a control circuit coupled to the array of memory cells and configured to determine a radiation dose received by each of said cells based on a change in threshold voltage for each of the memory cells after exposure to ionizing radiation and a predetermined average value for an intrinsic threshold voltage,
wherein the threshold voltage for each of the memory cells is determined using an analog reading.

11. The spatial dosimeter of claim 10, wherein the spatial dosimeter has a spatial resolution of less than 100 nanometers.

12. The spatial dosimeter of claim 10, wherein the control circuit is further configured to convert between cell addresses and cell physical positions.

13. The spatial dosimeter of claim 10, further comprising an interface coupled to the array of memory cells and the control circuit and configured to provide a measurement of the threshold voltages of said cells.

14. The spatial dosimeter pf claim 13, wherein the interface is configured to perform each analog reading.

15. The spatial dosimeter of claim 14, wherein the interface is configured to perform each analog reading in a test mode.

16. The spatial dosimeter of claim 15, wherein the control circuit is configured to place the interface in the test mode.

* * * * *

UNITED STATES PATENT AND TRADEMARK OFFICE
CERTIFICATE OF CORRECTION

PATENT NO. : 8,791,418 B2
APPLICATION NO. : 12/329740
DATED : July 29, 2014
INVENTOR(S) : Angelo Visconti et al.

Page 1 of 1

It is certified that error appears in the above-identified patent and that said Letters Patent is hereby corrected as shown below:

On the title page, item (56), References Cited under "Other Publications", in column 2, line 9, delete "Retreived" and insert -- Retrieved --, therefor.

In the Claims

Column 6, line 62, in claim 6, delete "claim" and insert -- claim 1, --, therefor.

Column 7, line 10, in claim 7, delete "as" and insert -- a --, therefor.

Column 8, line 18, in claim 14, delete "pf" and insert -- of --, therefor.

Signed and Sealed this
Thirtieth Day of September, 2014

Michelle K. Lee
*Deputy Director of the United States Patent and Trademark Office*